(12) United States Patent
Fatt et al.

(10) Patent No.: US 8,273,584 B2
(45) Date of Patent: Sep. 25, 2012

(54) LIGHT EMITTING DIODE

(75) Inventors: Chiang Chau Fatt, Melaka (MY); Kuek Hsieh Ting, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/976,668

(22) Filed: Dec. 22, 2010

(65) Prior Publication Data

US 2011/0092001 A1 Apr. 21, 2011

Related U.S. Application Data

(62) Division of application No. 12/051,390, filed on Mar. 19, 2008, now Pat. No. 7,947,990.

(51) Int. Cl.
*H01L 33/00* (2010.01)
(52) U.S. Cl. .............. 438/22; 438/29; 438/42; 257/79; 257/81; 257/88
(58) Field of Classification Search ............ 257/79, 257/81, 88, 33.005, E33.005; 438/22, 29, 438/42
See application file for complete search history.

(56) References Cited

U.S. PATENT DOCUMENTS

| 5,162,878 | A | 11/1992 | Sasagawa et al. |
| 2006/0278885 | A1 | 12/2006 | Tain et al. |
| 2007/0012933 | A1 | 1/2007 | Lee et al. |
| 2007/0048901 | A1 | 3/2007 | Hwan |
| 2007/0145382 | A1 | 6/2007 | Choi et al. |
| 2008/0087907 | A1 | 4/2008 | Park et al. |

*Primary Examiner* — Ha Tran T Nguyen
*Assistant Examiner* — Suberr Chi
(74) *Attorney, Agent, or Firm* — Dicke, Billig & Czaja, PLLC

(57) ABSTRACT

A semiconductor device including a wafer-level LED includes a semiconductor structure coupled to first and second electrodes. The semiconductor includes a P-doped portion of a first layer to an N-doped portion of a second layer. The first layer includes a surface configured to emit light. The first electrode is electrically coupled to the P-doped portion of the first layer on a first side of the semiconductor structure. The first side is adjacent to the surface that is configured to emit the light. The second electrode is electrically coupled to the N-doped portion of the second layer on a second side of the semiconductor structure. The second side is also adjacent to the surface that configured to emit light.

14 Claims, 4 Drawing Sheets

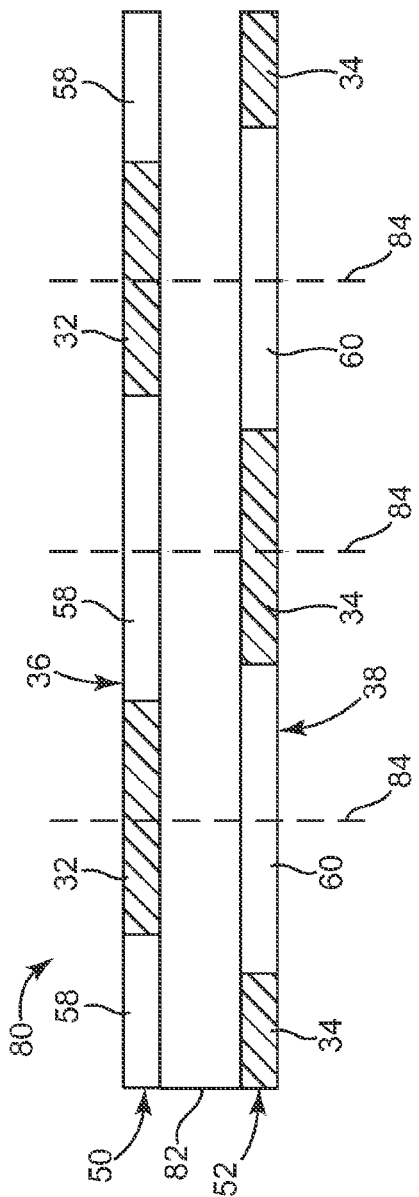
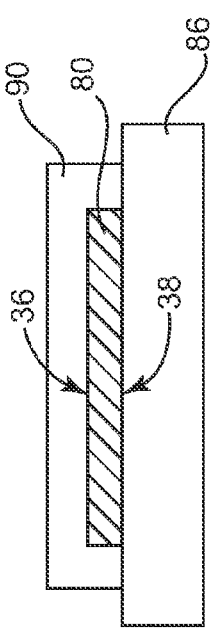
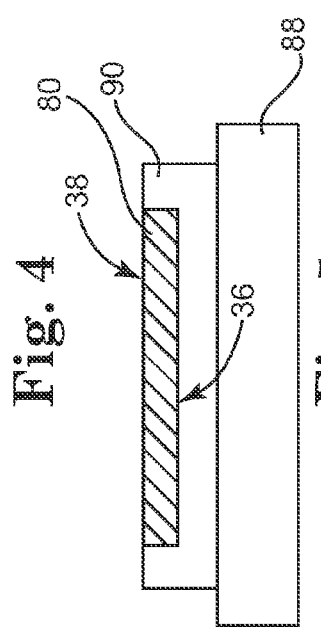
Fig. 3
Fig. 4
Fig. 5

LIGHT EMITTING DIODE

CROSS-REFERENCE TO RELATED APPLICATIONS

This Utility Patent Application is a divisional application of U.S. application Ser. No. 12/051,390, filed Mar. 19, 2008, which is incorporated herein by reference.

BACKGROUND

The present disclosure relates to a semiconductor device and its manufacture. More particularly, the present disclosure relates to a semiconductor device including wafer-level light emitting diode and a method for manufacturing the semiconductor device including a light emitting diode at the wafer-level.

A light emitting diode (LED) is a semiconductor device that transforms electrical power into a light source. The semiconductor device has a p-type region and an n-type region separated by a junction. The p-type region is dominated by positive electric charges, and the n-type region is dominated by negative electric charges. The junction acts as a barrier to the flow of electrons between the p-type and the n-type regions. Only when sufficient voltage is applied to the semiconductor device, can the current flow, and the electrons cross the junction from the n-type region into the p-type region. Once an electron enters the p-type region, it will recombine with a positive charge and emit a photon of light. The characteristics of this light, such as its color, depend on the design and materials used in the semiconductor device, and many different designs and materials are well known.

Compared with other light sources, the LED has advantages of low input voltage, low power consumption, and quick response time. Further, the LED can be mass produced and are light weight. The LED is ubiquitous in many areas of modern life, including electronic, communication, automotive, and consumer product fields.

As the market trend is moving towards thin and small electronic products, such as in the mobile phone market, LED manufacturers are also forced to keep improving their designs to provide for a smaller LED. Conventional LED manufacturing techniques include die bond and wire bond, molding, plating, and some require trimming and forming processes. Extensive manufacturing steps increase the expense of making an LED. Further, the current manufacturing steps produce an LED that is both wide and thick, and the overall volume of the LED is much greater than the ideal compared to the area of the LED actually producing light.

A convention LED structure requires a current source, which is provided from a semiconductor structure positioned along a side of a light emitting diode. The light emitting diode includes a p-type portion near the top, an n-type portion near the bottom, and emits light from the top. Current flows into the light emitting structure and is provided to the p-type region with a wire attached through soldering to the top of light emitting diode to contact the p-type portion of the light emitting structure. Current leaves the light emitting through a substrate underneath the light emitting structure. This results in an LED that is significantly wider and thicker than the light emitting diode.

SUMMARY

A semiconductor device with a wafer-level light emitting diode is illustrated and described. The semiconductor device includes a semiconductor structure coupled to first and second electrodes. The semiconductor structure includes a P-doped portion of a first layer to an N-doped portion of a second layer. The first layer includes a surface configured to emit the light. The first electrode is electrically coupled to the P-doped portion of the first layer on a first side of the semiconductor structure. The first side is adjacent to the surface that is configured to emit the light. The second electrode is electrically coupled to the N-doped portion of the second layer on a second side of the semiconductor structure. The second side is also adjacent to the surface that configured to emit the light.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 3 is a side sectional view of a schematic representation of a semiconductor wafer used in the manufacture of the LED of FIG. 1.

FIG. 4 is a side sectional view of a manufacturing feature of the LED of FIG. 1 from the wafer of FIG. 3.

FIG. 5 is a side sectional view of another manufacturing feature of the LED of FIG. 1 from the wafer of FIG. 3.

DETAILED DESCRIPTION

The present disclosure provides for an LED manufacturing process that eliminates the need for the die bond and the wire bond in processing. With the elimination of these steps, the resulting LED is reduced in size without sacrificing effective light output as compared to conventional LED's. Additionally, the cost of manufacture and the length of the process cycle time can both be reduced.

In the following Detailed Description, reference is made to the accompanying drawings, which form a part hereof, and in which is shown by way of illustration specific embodiments in which the invention may be practiced. In this regard, directional terminology, such as "top," "bottom," "side," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
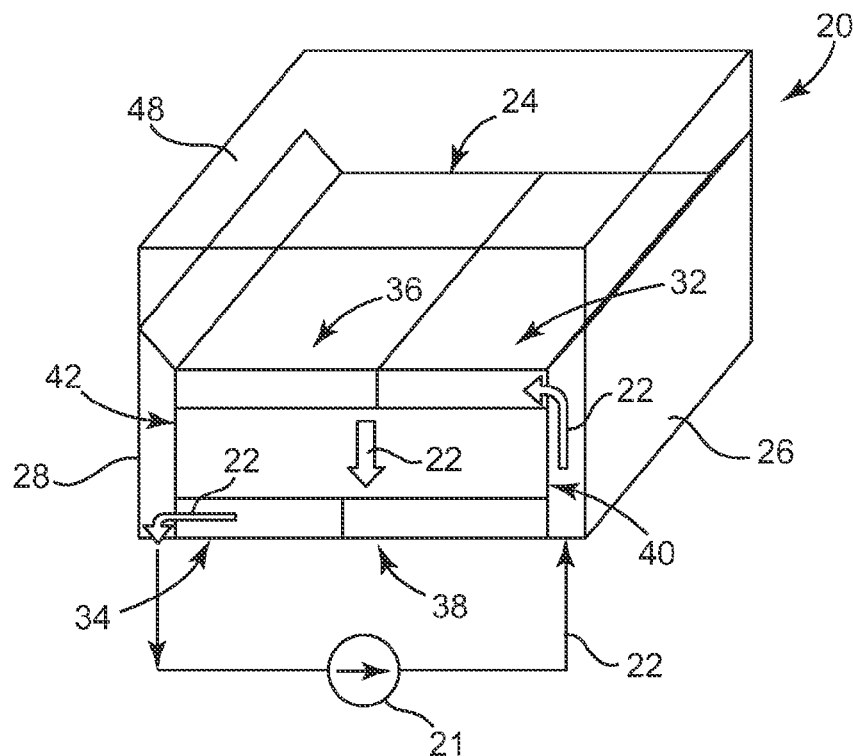
FIG. 1 is an isometric view of a schematic representation of an LED of the present disclosure.

This disclosure relates to semiconductor devices and the manufacture of semiconductor devices, such as light emitting diodes. The disclosure, including the figures, describes the light emitting diodes and their manufacture with reference to a several illustrative examples. The present invention, however, could be implemented as other semiconductor devices, as other forms of light emitting diodes as well. Further, the manufacturing processes can be implemented with other steps or in different order than the process described below. The present invention is described with respect to the examples illustrated in the figures for illustrative purposes only. Other examples are contemplated and are mentioned below or are otherwise imaginable to someone skilled in the art. The scope of the invention is not limited to the few examples, i.e., the described embodiments of the invention. Rather, the scope of the invention is defined by reference to the appended claims. Changes can be made to the examples, including alternative designs not disclosed, and still be within the scope of the claims FIG. 1 illustrates a semiconductor device with a light emitting diode (LED) 20 of the present disclosure coupled to a current source 21 that provides a current flow 22. The LED includes a semiconductor structure 24 and a pair of conducting electrodes 26, 28. The conducting electrodes couple the semiconductor structure to the current source so that the current from the current source passes through the semiconductor structure, which causes the semiconductor structure to emit a light 30.

The semiconductor structure 24, such as a diode, includes a junction layer 32 and a junction layer 34 and is bound by a plurality of surfaces. The semiconductor structure emits light from a top major surface 36, which is spaced apart from a bottom surface 38. The semiconductor structure also includes first 40 and second 42 side surfaces. In the example, the first side surface 40 is coupled to the junction layer 32 and second side surface 42 is coupled to the junction layer 34. The first electrode 26 is coupled directly to the first side surface 40, and the second electrode 28 is couple directly to the second side surface 42.

The LED 20 can further include a translucent layer 48 overlying the top major surface 36. The translucent layer allows the light to pass out of the LED from the top major surface. In one example, the translucent layer is generally transparent. For this, the transparent layer 48 can be formed from a resin or other suitable material applied to the semiconductor structure 24 during its manufacture. In one example, the transparent material is applied during the construction of a semiconductor wafer. In the example shown, the resin overlies both the top major surface 36 and the electrodes 26, 28.

Figure 2:
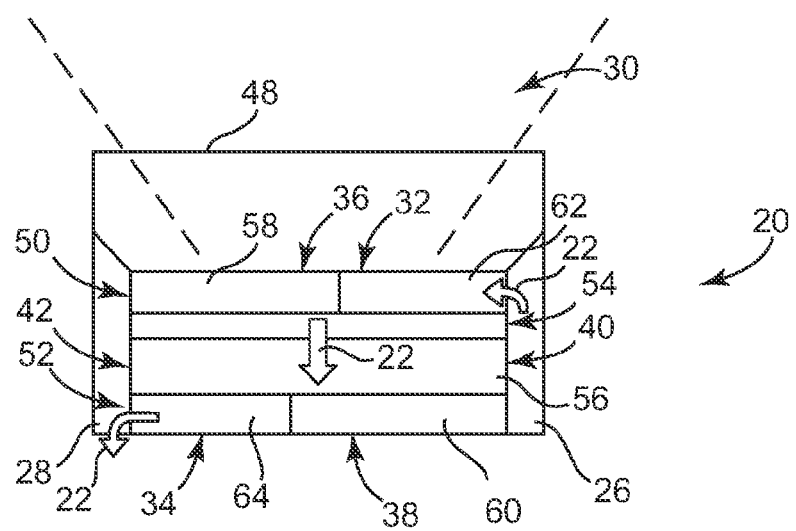
FIG. 2 is side view of a schematic representation of the LED of FIG. 1.

The semiconductor structure 24 can take on any suitable one of numerous forms. In a popular example illustrated in FIG. 2, the semiconductor structure is formed as a plurality of layers arranged from the top major surface 36 to the bottom surface 38. In a general embodiment, a P-layer 50 includes the top major surface 36, which will emit the light 30. An N-layer 52 is spaced apart from the P-layer 50. The P-layer 50 and N-layer 52 in the example are partially filled with a P-doped material portion 58, and an N-doped material portion 60, respectively. The remaining portions of the layers 50, 52 are filled with conductors 62, 64, respectively. In the example, the top major surface 36 includes a P-type portion 58 and the conductor 62, and the bottom surface 38 includes the N-type portion 60 and a separate conductor 64. In this case, the first electrode 26 is directly coupled to the conductor 62 occupying the portion of the P-layer 50, and the second electrode 28 is directly coupled to the conductor 64 occupying the portion of the N-layer 52.

A number of other layers, such as layers 54, 56 in the example, may be formed between the P-layer 50 and an N-layer 52. These other layers can include layers suited for defining the characteristics and color of the emitted light, or other characteristics of the LED. In still other examples, the N-layer 52 need not include the bottom surface of the LED. Rather, the N-layer 52 can overlie another layer or layers which would then include the bottom surface.

In the particle example shown, the P-type portion 58 is formed of a P-type gallium nitride (GaN) and the N-type portion 60 is formed of an N-type gallium nitride (GaN). Other suitable P and N type materials can be used to form junctions. The conductors 62, 64 include an electrically conductive material. For example, the conductors can include a metallic substance such as a conductive pure metal or metal alloy. In one example, the conductors 62, 64 are comprised of gold (Au). Layers 54, 56 may be two different silicon materials that provide design characteristics to the functions of the LED 20. Many other specific examples of the semiconductor structure 24 are contemplated and these specific examples are within the scope of this disclosure. Also in this example is that the conductors 62, 64 take up less area than the P-type 58 and N-type 60 portions in layers 50 and 52, respectively, although other configurations are contemplated.

FIG. 3 illustrates a cross section of a length of a semiconductor wafer 80 that helps illustrate a general manufacturing process for fabricating the LED 20. The wafer 80 has a plurality of layers including a P-layer 50 and an N-layer 52. In this example, the top surface 36 corresponds with the top surface of the P-layer 50 and the bottom surface 38 corresponds with n-layer 52. Other layers are possible such as a layer 82 in between the layers 50 and 52. Layer 50 includes a plurality of first conductors 32 space-apart from each other by a plurality of P-type portions 58 along the length of the wafer 80. Layer 52 includes a plurality of second conductors 34 space-apart from each other by a plurality of N-type portions 60 along the length of the wafer 80. Phantom lines 84 are used to help illustrate the locations of the semiconductor structures 24 from above as they would appear on the wafer.

During the process for fabricating the LED 20, the wafer 80 is formed to include a plurality of troughs extending from the top surface to the bottom surface along phantom lines 84. The troughs would define side surfaces 40, 42 of the semiconductor structures 24 formed from the wafer. The troughs are then filled with an electrically conducting material. The electrically conducting material is cut through the wafer, also along the phantom lines 84 which would then form electrodes out of the electrically conductive material and separate the wafer into semiconductor structures shown above.

In one example, a translucent layer can be cast onto the top surface 36 prior to forming troughs. The cut through the wafer can be extended to cut through the translucent layer. In the example, the semiconductor structure is designed to provide a light emitting diode, although the process as described can be used to create other semiconductor devices where electrodes are required along the side of device instead of on the top major surface.

A more detailed illustration of the process for fabricating the LED is set out in FIGS. 4-8.

FIG. 4 is a side view of the wafer 80 with the bottom surface 38 set upon a manufacturing article 86 such as a lamination foil. In the example, a material 90 is cast or molded onto the major top surface 36 of the wafer. In this example, the material 90 is translucent. Preferably, the material 90 is generally transparent. In the example, the material 90 is a resin that is hardened onto the wafer 80 by curing, such as by the use of ultraviolet radiation. FIG. 5 is a side view of the wafer 80 and translucent layer 90 where they have been transferred onto a second manufacturing article 88, and the first manufacturing article 86 has been removed so as to expose the bottom surface 38 for further fabrication of the LED.

Figure 6A:
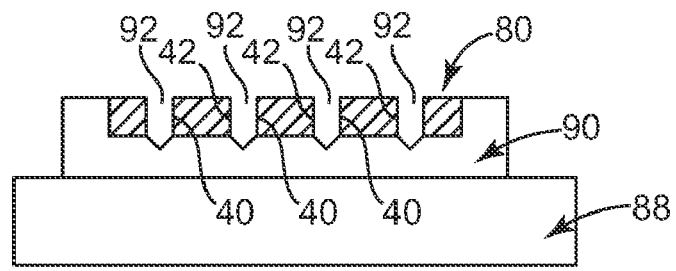
FIG. 6A is a side sectional view of another manufacturing feature of the LED of FIG. 1 from the wafer of FIG. 3.
Figure 6B:
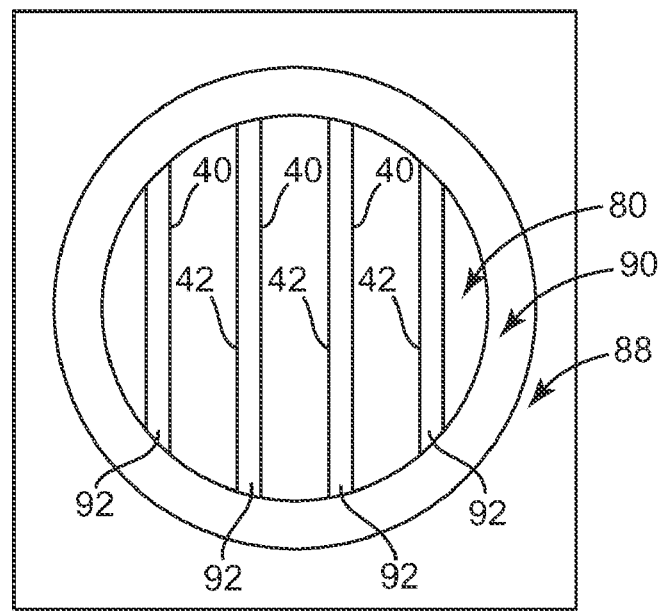
FIG. 6B is a top view of the manufacturing feature of FIG. 6A.

FIG. 6A is a side view of the wafer 80 and translucent layer 90 after troughs 92 have been formed in to the wafer 80 along its length. In this example, the troughs 92 extend through the waver 80 but not through the translucent layer 90. FIG. 6B is a top view of the wafer 80 and troughs 92. In the example, the troughs 92 are sawed through each of the first and second conductors 32, 34 along the length of the wafer. The troughs 92 are relatively wide cuts that extend across the length of the wafer in a parallel fashion as shown in the example. The troughs 92 also serve to define the first and second side surfaces 40, 42 of the forming semiconductor structures 20 in the process.

Figure 7:
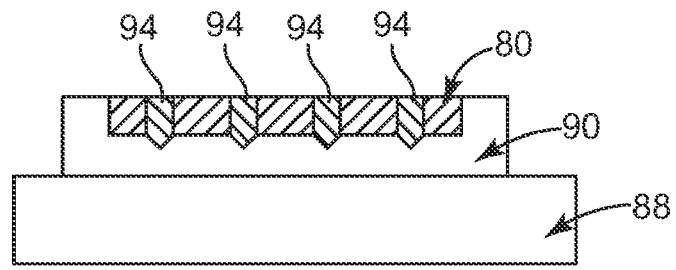
FIG. 7 is a side sectional view of another manufacturing feature of the LED of FIG. 1 from the wafer of FIG. 3.
Figure 8A:
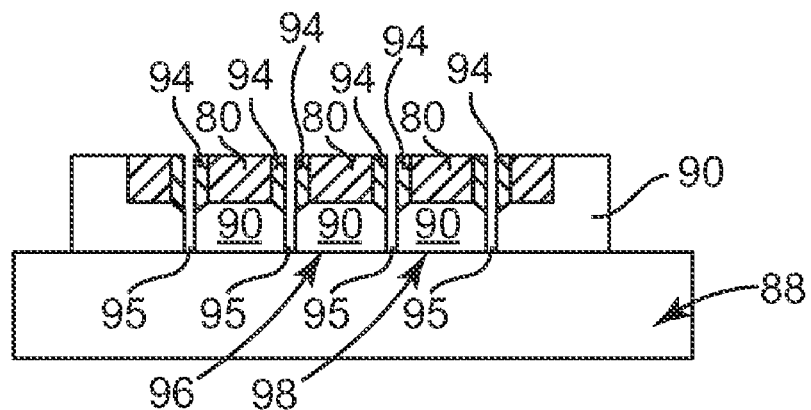
FIG. 8A is a side view of a manufacturing feature of the LED of FIG. 1 from the wafer of FIG. 3.
Figure 8B:
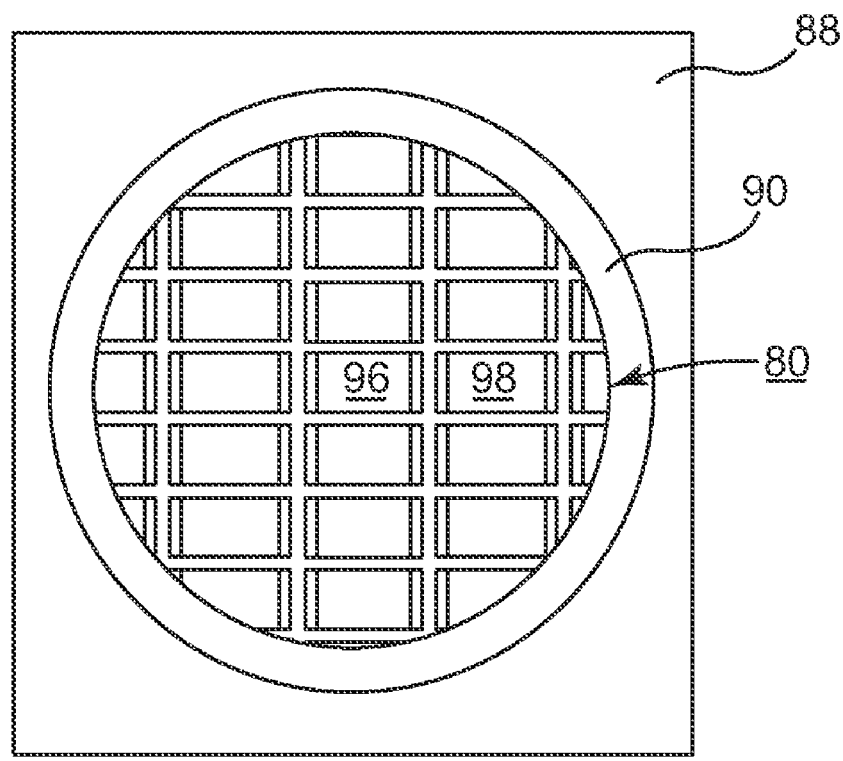
FIG. 8B is a top view of the manufacturing feature of FIG. 8A.

FIG. 7 is a side view of the wafer 80 wherein the troughs have been filled with an electrically conductive material 94. After the electrical material 94 has been sufficiently hardened, or is ready to be cut, the wafer is cut again, as shown in FIG. 8. As shown in FIG. 8A, the electrical material 94 is cut, preferably in half as shown in reference character 95, with a blade relatively thinner than the blade used to form the troughs 92. This way, the electrical material 94 can been separated into two portions that form the electrodes of separate LEDs 96, 98. A current source can be connected directly to the electrodes in order to operate the LED, without additional steps of die bonding along the length or width of the LED and wire bonding along the height of the LED. FIG. 8B shows that the wafer 80 can be cut again, this time along the length of the wafer, to singularize each LED. In one example, the cut is in a direction orthogonal to the cut through the conductive material 94. The second manufacturing article 88, or lamination foil, is also removed.

Additional manufacturing can be performed. The LED can be taped prior to packaging in a manner known in the art. The LED can also be tested by connecting the electrodes to a current source. Additional manufacturing can be contemplated. With the design of the present disclosure, however, there is no need to include die bonding additional structures adjacent to the LED, and there is no need to wire bond the LED with a wire from one of the additional structures onto the top surface of the LED.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of making a light emitting diode, the method comprising:
providing a semiconductor wafer having a top major surface and a bottom surface opposite the top major surface, wherein the semiconductor wafer includes a plurality of layers between the top major and bottom surfaces, including
a p-layer having a plurality of first conductors spaced-apart from each other by p-type portions along a length of the semiconductor wafer, and
an n-layer having a plurality of second conductors spaced-apart by n-type portions and spaced-apart and staggered apart from the plurality of first conductors along the length of the semiconductor wafer;
forming a translucent layer on the top major surface of the semiconductor wafer;
forming the semiconductor wafer to include a plurality of troughs along the length of the semiconductor wafer wherein the troughs extend from the bottom surface into the translucent layer and through the first and second conductors, the troughs defining side surfaces of the semiconductor structure along the length of the semiconductor wafer;
filling the troughs with an electrically conducting material coupled to the side surfaces; and
cutting through each of the filled troughs to form electrodes out of the electrically conducting materials.

2. The method of claim 1 and further comprising placing the bottom surface on a first lamination article prior to the translucent layer on the top major surface, and transferring the semiconductor wafer onto a second lamination article by placing the translucent layer on the second lamination article.

3. The method of claim 2 wherein forming the translucent layer includes casting a resin onto the top major surface and curing the resin on the top major surface.

4. The method of claim 1 wherein the translucent layer is generally transparent.

5. The method of claim 1 wherein forming the plurality of troughs includes cutting the plurality of troughs into the semiconductor wafer along the length of the semiconductor wafer and in a direction generally orthogonal to the length of the semiconductor wafer.

6. The method of claim 5 wherein cutting through each of the filled troughs includes cutting through the semiconductor wafer and the translucent layer.

7. The method of claim 1, and further comprising cutting the semiconductor wafer and translucent layer along the length of the semiconductor structure.

8. A method of making a semiconductor device, the method comprising:
providing a semiconductor wafer having a top major surface and an opposing bottom surface, wherein providing the semiconductor wafer includes:
forming a p-layer having a plurality of first conductors spaced-apart from each other by p-type portions along a length of the semiconductor wafer, and
forming an n-layer having a plurality of second conductors spaced-apart by n-type portions and spaced-apart and staggered apart from the plurality of first conductors along the length of the semiconductor wafer;
forming the semiconductor wafer to include a plurality of troughs along the length of the semiconductor wafer wherein the troughs extend from the bottom surface to the top major surface and through the first and second conductors;
filling the troughs with an electrically conducting material;
cutting through each of the filled troughs to form electrodes out of the electrically conducting material.

9. The method of claim 8 wherein forming the semiconductor layers includes forming at least one layer in between the p-layer and the n-layer.

10. The method of claim 8 wherein the semiconductor device is a light emitting diode.

11. The method of claim 10 wherein the top major surface is configured to emit light.

12. The method of claim 8 wherein the plurality of troughs expose the first and second conductors along sidewalls of the semiconductor layers before the troughs are filled with electrically conducting material.

13. The method of claim 8 and further comprising cutting through the semiconductor wafer along a length to form four sidewalls on the semiconductor device.

14. The method of claim 12 wherein the four sidewalls are orthogonal to the top major surface.

\* \* \* \* \*